United States Patent [19] [11] 3,919,765
Schloetterer [45] Nov. 18, 1975

[54] METHOD FOR THE PRODUCTION OF INTEGRATED CIRCUITS WITH COMPLEMENTARY CHANNEL FIELD EFFECT TRANSISTORS

[75] Inventor: Heinrich Schloetterer, Putzbrunn-Solalinden, Germany

[73] Assignee: Siemens Aktiengesellschaft, Berlin & Munich, Germany

[22] Filed: Mar. 28, 1974

[21] Appl. No.: 455,590

[30] Foreign Application Priority Data

Mar. 30, 1973 Germany .......................... 2316095

[52] U.S. Cl. .................... 29/571; 29/578; 357/42; 357/73; 148/191

[51] Int. Cl.² .......................................... B01J 17/00

[58] Field of Search ............ 29/571, 578; 148/191; 357/42, 73

[56] References Cited

UNITED STATES PATENTS

| | | | |
|---|---|---|---|
| 3,673,679 | 7/1972 | Carbajal | 29/571 |
| 3,783,052 | 1/1974 | Fisher | 148/191 |
| 3,837,071 | 9/1974 | Ronen | 29/571 |

OTHER PUBLICATIONS

RCA–Technical Notes, TN No. 891, Greig & Jackson, June 21, 1971.

IBM Technical Disclosure Bulletin, Vol. 11, No. 4, Sept. 1968, p. 397, Statz.

*Primary Examiner*—W. Tupman
*Attorney, Agent, or Firm*—Hill, Gross, Simpson, Van Santen, Steadman, Chiara & Simpson

[57] ABSTRACT

Method of producing integrated circuits with complementary channel field effect transistors which includes doping a semiconductor member with two different impurities of a different type in two definite, but different concentrations, forming a protective layer over predetermined portions of a major surface of the semiconductor member, forming a getter layer over exposed portions of the said surface of a material that will getter the impurities of the greater concentration in said member whereby regions of one impurity type are left under the getter layer and regions of the opposite impurity type are left under the protective layer, thereafter forming source and drain regions respectively in said region below said getter layer and in the region below said protective layer, said source and drain regions being of opposite impurity type from the regions in which they are formed, forming an insulating layer over a portion of the semiconductor member between said source and drain regions, and forming gate electrodes on said insulating layers between said source and drain regions.

9 Claims, 6 Drawing Figures

METHOD FOR THE PRODUCTION OF INTEGRATED CIRCUITS WITH COMPLEMENTARY CHANNEL FIELD EFFECT TRANSISTORS

BACKGROUND OF THE INVENTION

The present invention relates to the field of integrated circuits which has included therein complementary channel field effect transistors. Integrated circuits with complementary channel field effect transistors are known in general from the so-called complementary channel MOS technique. They may, for instance, be produced by using a well diffusion or by ion implantation. These processes in the past, however, have very strict requirements in respect to tolerances and have been expensive.

BRIEF SUMMARY OF THE INVENTION

The present invention provides a novel method for producing integrated circuits with complementary channel field effect transistors. The process includes starting with a semiconductor member having two different impurities of a different type in definite, but different concentrations therein. In other words, the semiconductor member has an n-type impurity doping of one concentration level and a p-type impurity doping of a different concentration level. Portions of the surface of the semiconductor member above one region where a transistor is to be formed is coated with a protective layer and other portions of the semiconductor member above which a complementary transistor is to be formed is covered with a getter layer. During the formation of the getter layer, gettering takes place with respect to one of the dopants in the semiconductor member below the getter layer during the time that the getter layer is being formed. This changes this region from being predominantly one type of impurity concentration to predominantly the other type of impurity concentration. Source and drain regions are then formed in the region below the getter layer and in the region below the protective layer. The gettering layer is preferably a silicon dioxide layer which is pyrolytically formed. The end product of the above process is to provide in an integrated circuit, a pair of complementary field effect transistors of the MOS type.

CROSS REFERENCE TO RELATED APPLICATION

Applicant has filed concurrently herewith an application to a related process entitled "Method For The Production of Integrated Circuits With Field Effect Transistors of Variable Line Condition", identified as Case No. 74,166, and assigned to the same assignee as the present invention. This related case uses a similar gettering process for changing the impurity concentration in a semiconductor member to form two field effect transistors having a variable line condition with respect to each other.

DETAILED DESCRIPTION

Figure 1:
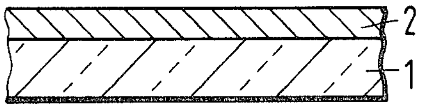
FIGS. 1 to 6 of the drawings are partial sectional views illustrating the principal successive steps in forming an integrated circuit withh complementary field effect transistors of the MOS type.
Figure 2:
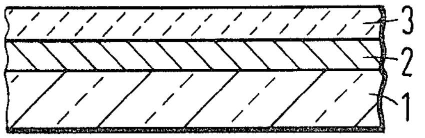

One of the principal features of the present invention is due to the selective gettering which overcomes the disadvantages of known well diffusion or double epitaxy or ion implantation and is substantially less costly. The individual method steps for producing the integrated circuit is illustrated by the various successive figures of the drawing. In this method, a semiconductor layer, such for example, as silicon, is doped with donors and acceptors as impurities in different relative concentrations. Gettered and ungettered areas can then be produced in the semiconductor layer by means of getter layers and by means of protective coverings. This results in having the ungettered areas located under the coverings continuing to have basically their original concentration of impurities, while the gettered areas, i.e., those under the getter layer, have a reduced concentration of the dominant impurity.

Referring now to FIG. 1, there is shown a substrate 1 formed of spinel or sapphire which has a silicon layer 2 formed thereon. The silicon semiconductor layer 2 is doped during its production with impurities of two types, i.e., with acceptors and donors. By way of example, this layer 2 may be doped with aluminum acceptors having a concentration of $N_A$ and phosphor donors of a concentration of $N_D$. Thus, the following applies:

$$n_p = N_A - N_D \text{ and } N_A > N_D$$

According to a further embodiment of the invention, the doping of a semiconductor layer applied onto a substrate of spinel or sapphire with aluminum acceptors can be employed with a process in which the semiconductor layer 2 is applied onto the substrate 1. Thereby during the growth, aluminum impurities from the spinel or sapphire substrate 1 reach the silicon layer 2.

Figure 3:
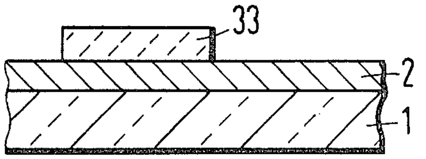

The next step of the method is to form a layer 3 on the surface of the silicon layer 2. This layer 3 should preferably consist of pyrolytically deposited silicon nitride. As shown in FIG. 3, portions of this cover layer 3 are etched away leaving portions 33. This may be done by any generally known photolithographic method.

Figure 4:
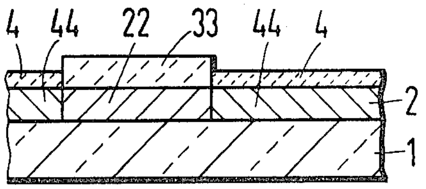

Thereafter, as shown in FIG. 4, a getter layer 4 is formed on the exposed surface of the silicon layer 2. This getter layer 4 preferably consists of a layer of thermic silicon oxide, whereby during the oxide production, the gettering process takes place. An additional getter treatment, for instance by subsequent annealing may take place. Due to the getter process the concentration of one type of the impurities contained in the areas 44 under the getter layer is strongly decreased and the concentration of the other type is maintained or increased. Thus for instance during the getter process of a silicon layer such as described above which is doped with aluminum acceptors and phosphor donors and which have the concentration of the acceptors larger than the concentration of the donors, n-conductive areas 44 are created under the getter layers since the aluminum impurities increase due to the distribution coefficient at $Si/SiO_2$ in the getter layer. The concentration after the getter process in $N'_A$ or $N'_D$ respectively. The following applies to the gettered areas:

$$n_n = N'_D - N'_A$$

where $N'_D$ is larger than $N'_A$. In the areas 22 under the covering 33 which protects these areas against the getter process the original concentration of the impurities, means that the acceptors and the donors is nearly maintained. It results for the quoted examples of the doping of the silicon layer 2 with aluminum and phosphor that this area remains p-conductive.

Figure 5:
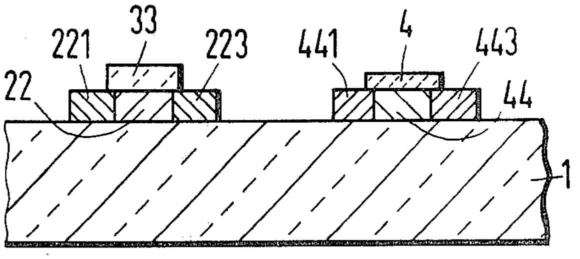

As is illustrated in FIG. 5, p-conductive areas 22 and n-conductive areas 44 are contained in the semiconductor layer 2, by means of generally known photolithographic method steps, for instance, after the removal of the silicon which is not required between the active areas by means of island etching and after partial removal of the getter layer 4 and the coverings 33, areas 221 and 223 or 441 and 443 are created in the areas 22 and 44 of different conductivity by diffusion whereby a part of the getter layer as well as a part of the covering layer can be used as mask during the diffusion. Thereby these areas constitute the source or drain areas respectively of the field effect transistors of different conductivity. The areas are doped opposite to the areas 22 and the areas 44.

Gate insulators 5 are applied onto the areas 44 or 22 respectively in generally known method steps. The areas 221, 223, 441 and 443 which constitute the source or drain areas respectively of the field effect transistors are provided with electrodes (not shown) and the gate insulators are provided with electrodes 6.

The field effect transistors which are produced from the areas 44 or 22 respectively differ in the sign of the charge carrier in the channel.

Figure 6:
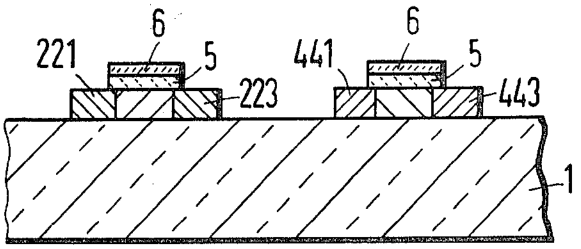

FIG. 6 shows the finished arrangement of the complementary transistors whereby for instance in this technique with insulating substrate the two areas 223 and 441 can also directly contact each other and can in addition be connected by a metal electrode with each other to form a complementary inverter. For the production of complementary MOS arrangements for instance a concentration of $n_p = 1$ to $4.10^{16}$ $cm^{-3}$ from the gettering in the semiconductor layer and a concentration in the gettered areas of $n_n = 2$ to $4.10^{15}$ $cm^{-3}$ is most favorable.

It will be apparent to those skilled in the art that many modifications and variations may be effected without departing from the spirit and scope of the novel concepts of the present invention.

I claim:

1. A method for producing an integrated circuit having at least two complementary field effect transistors which includes taking a semiconductor body which has dopings of both impurity types, one doping being in greater concentration than the other, gettering one region thereof of its predominant dopant where one transistor is to be formed to reverse the predominant doping therein, and protecting a second region of said body where a second transistor is to be formed to maintain its original dopings in the original concentrations, and forming a field effect transistor in each of said regions whereby the channels of the two transistors have different predominant dopings, thereby providing complementary field effect transistors.

2. A method for producing an integrated circuit having at least one pair of complementary field effect transistors which includes starting with a silicon layer having dopings of both impurity types, one doping being in greater concentration than the other, covering one surface of said silicon layer with a protective covering which will not getter either of the impurities from any region lying therebelow, removing a portion of the protective covering where one field effect transistor is to be formed, forming a gettering layer over the thus exposed surface to getter the predominant impurity from the region therebelow, forming one field effect transistor in an ungettered region of said silicon layer, forming a second field effect transistor in the gettered region, covering the said one surface of said silicon layer with a layer of electrical insulating material, forming source and drain electrodes on the source and drain regions of each field effect transistor, and forming a gate electrode on said insulating layer above each of the channel regions of said field effect transistors.

3. A method according to claim 2, in which the dopings in the silicon layer are aluminum acceptors and phosphor donors, the acceptors having a greater concentration than the donors.

4. A method according to claim 2, in which the silicon layer is grown epitaxially on a silicon substrate.

5. A method according to claim 2, in which the silicon layer is formed on an electrically insulating substrate.

6. A method according to claim 2, in which the silicon layer is formed on an insulating substrate of spinel.

7. A method according to claim 2, in which the silicon layer is a formed on an insulating substrate of sapphire.

8. A method according to claim 2, in which the protective coating is pyrolytically deposited silicon nitride layer.

9. A method according to claim 2, in which the gettering layer is a layer of thermic silicon oxide.

* * * * *